(12) United States Patent
Hirtzlin et al.

(10) Patent No.: US 7,274,919 B2
(45) Date of Patent: Sep. 25, 2007

(54) RADIOFREQUENCY TRANSMITTER AND/OR RECEIVER

(75) Inventors: Patrice Hirtzlin, Rennes (FR); Jean-Yves Le Naour, Pace (FR); Patrick Wurm, Cambridge (GB)

(73) Assignee: Thomson Licensing, Boulogne-Billancourt (FR)

( * ) Notice: Subject to any disclaimer, the term of this patent is extended or adjusted under 35 U.S.C. 154(b) by 686 days.

(21) Appl. No.: 09/874,341

(22) Filed: Jun. 5, 2001

(65) Prior Publication Data

US 2001/0049271 A1    Dec. 6, 2001

(30) Foreign Application Priority Data

Jun. 6, 2000  (FR) .................................. 00 07421

(51) Int. Cl.
*H04B 1/18*    (2006.01)
*H04B 1/40*    (2006.01)

(52) U.S. Cl. .............................. 455/188.1; 455/189.01; 455/261; 455/266

(58) Field of Classification Search ................ 455/427, 455/431, 561, 188.1, 266, 189.1
See application file for complete search history.

(56) References Cited

U.S. PATENT DOCUMENTS 3,414,821 A    12/1968  Bickers et al. .............. 325/433
5,483,209 A    1/1996   Takayama ................... 333/174
5,731,699 A *  3/1998   O'Byrne .................. 324/77.11
5,790,959 A *  8/1998   Scherer ..................... 455/561

FOREIGN PATENT DOCUMENTS

| | | |
|---|---|---|
| DE | 19731480 | 5/1998 |
| EP | 401932 | 12/1990 |
| EP | 771069 | 5/1997 |
| JP | 4208723 | 7/1992 |
| WO | 95/19074 | 7/1995 |

OTHER PUBLICATIONS

Patent Abstracts of Japan, vol. 016, No. 550, Nov. 19, 1992 & JP 4208723.
French Search Report citing the above-listed documents: AA, AB, AC, AD, AE, AF, AG, AH, and AI.

* cited by examiner

*Primary Examiner*—Rasha S. Al-Aubaidi
(74) *Attorney, Agent, or Firm*—Joseph J. Laks; Robert D. Shedd; Brian J. Cromarty

(57) ABSTRACT

The invention provides a simple solution for a broadband transmitter/receiver for which the working bandwidth is split into at least two non-contiguous sub-bands. The invention uses a filtering means 50 which comprises at least two band-pass filters 51 and 52 provided with switching means 53 and 54. The use of two switched filters 51 and 52 makes it possible to use a single synthesizer 6 to scan two sub-bands of the working bandwidth. The frequency synthesizer 6 operates for one sub-band in supradyne mode and for the other sub-band in infradyne mode. In a variant, the invention uses a third filter and divides the bandwidth into three sub-bands.

10 Claims, 3 Drawing Sheets

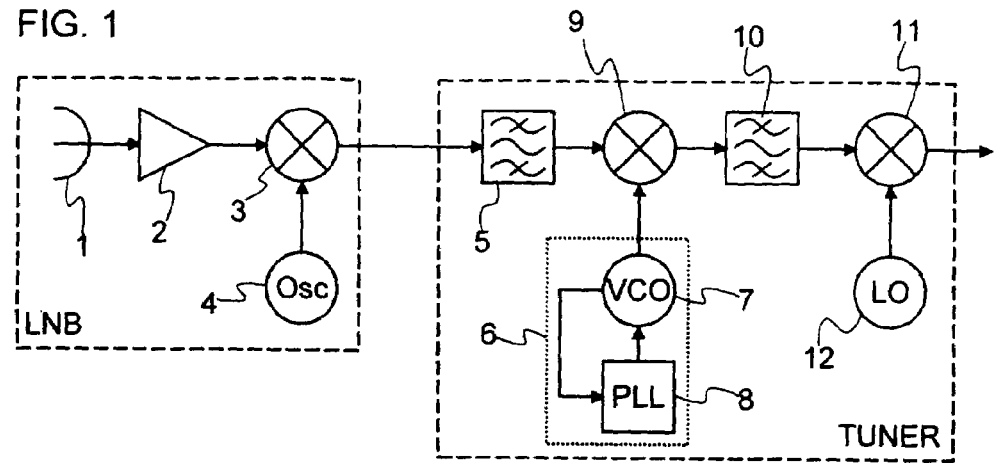
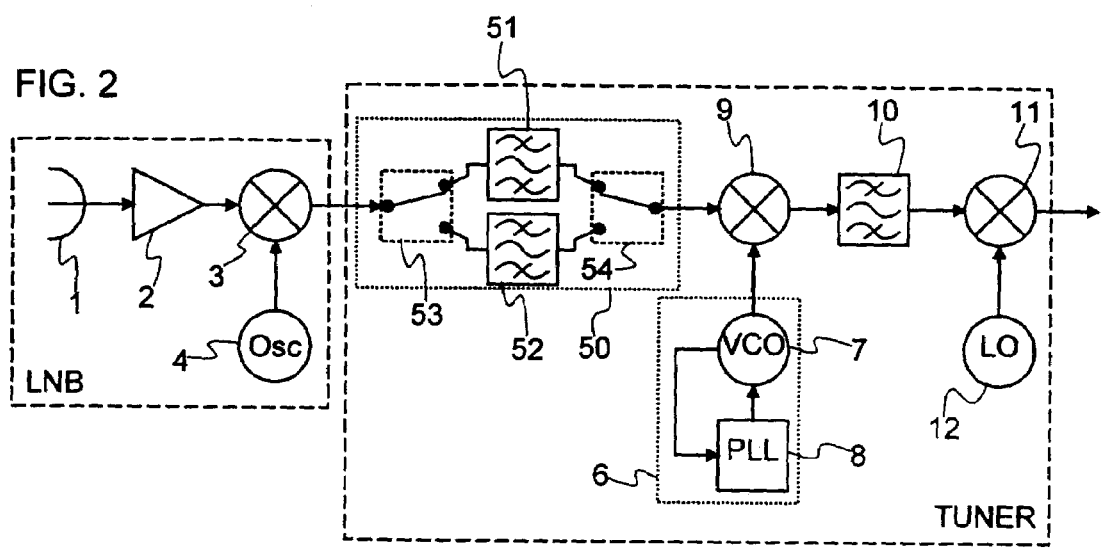
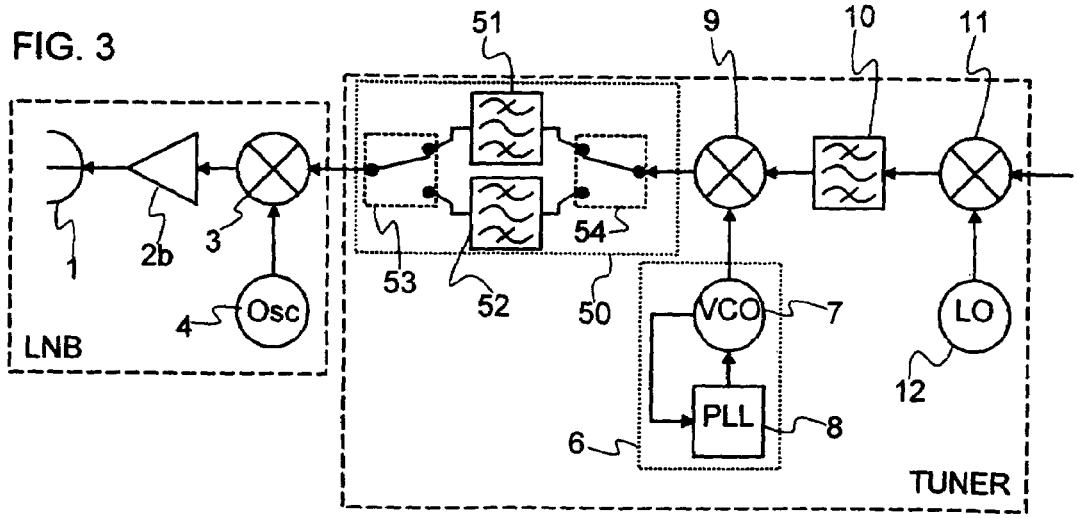

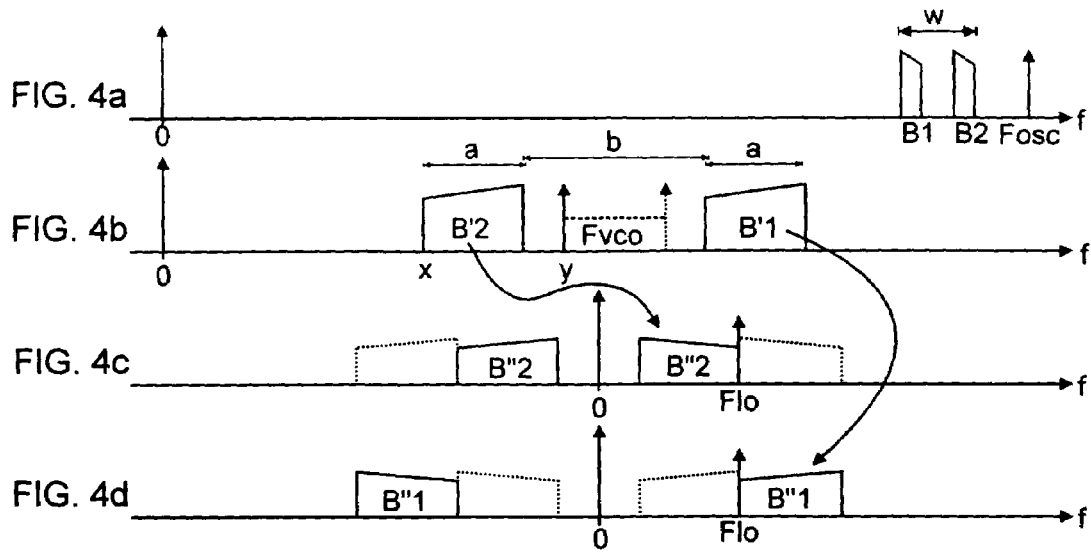
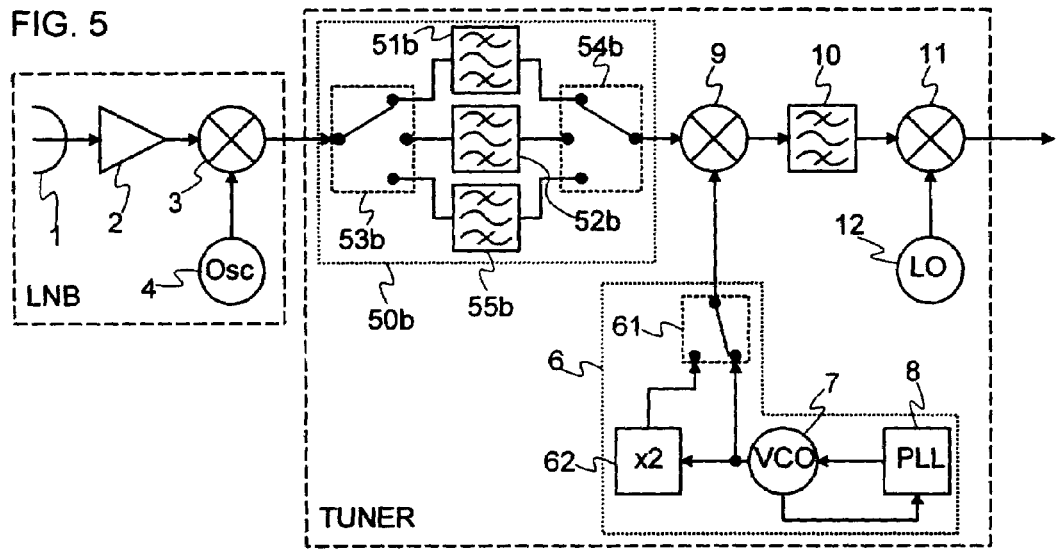
FIG. 5
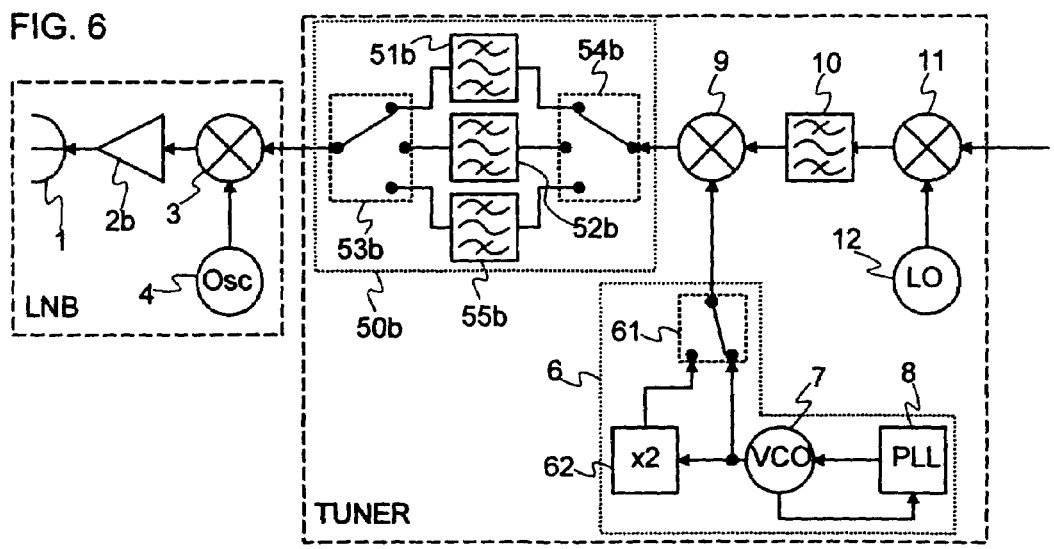
FIG. 6

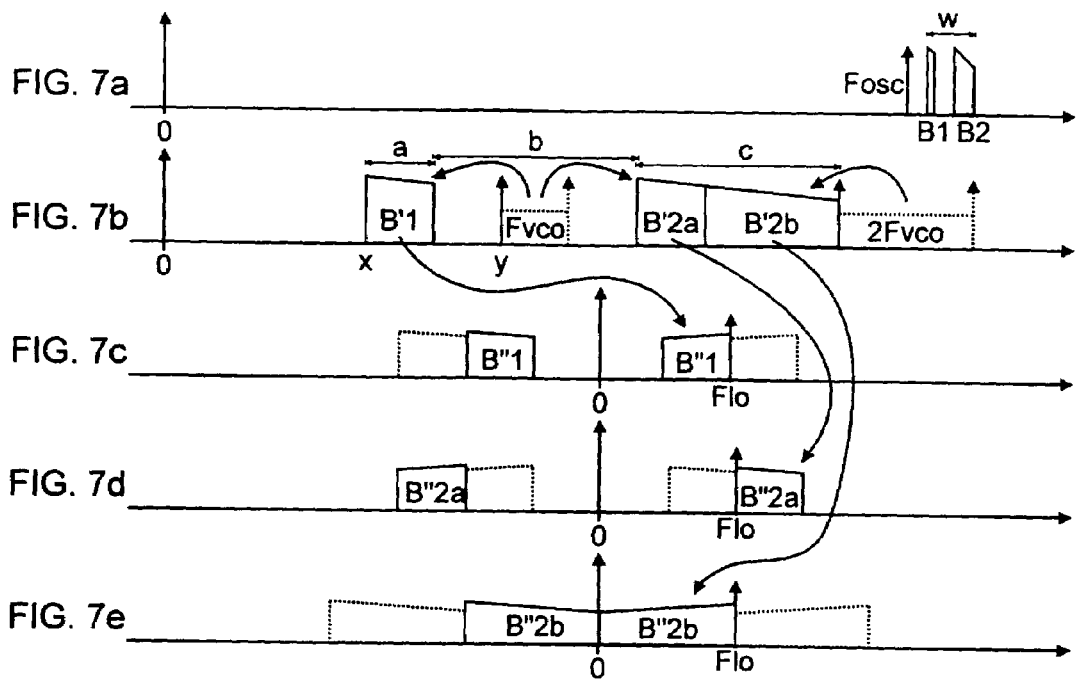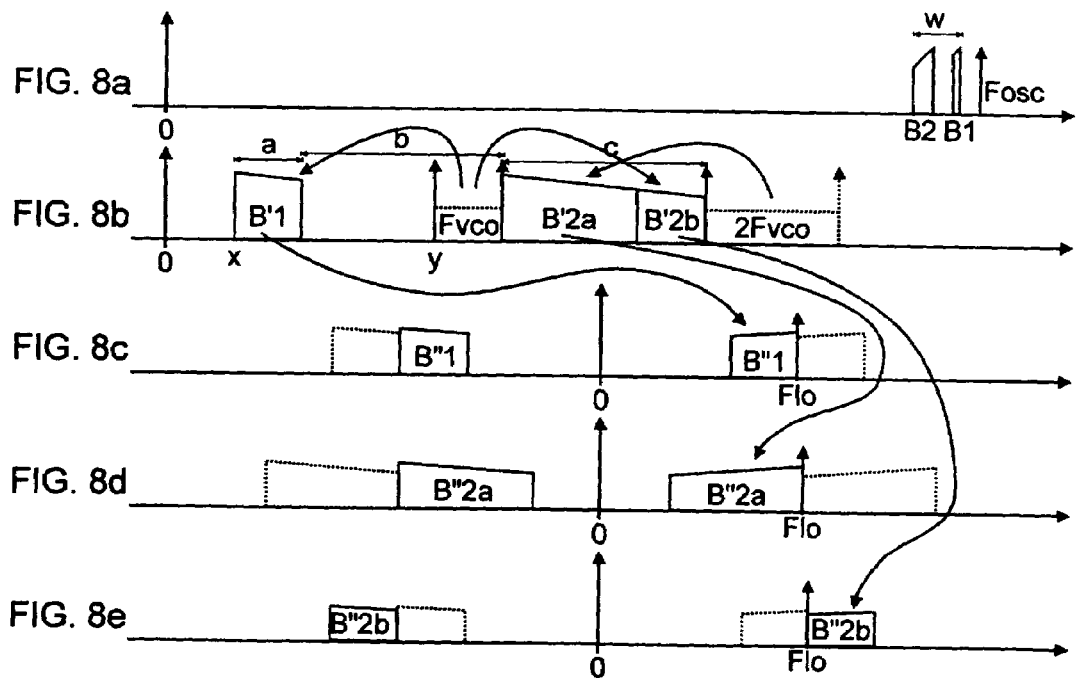

RADIOFREQUENCY TRANSMITTER AND/OR RECEIVER

BACKGROUND OF THE INVENTION

1. Field of the Invention

The invention relates to a radiofrequency transmitter and/or receiver. More particularly, the invention relates to satellite broadcasting devices.

2. Description of the Prior Art

Satellite broadcasting has many advantages over radio transmission called "terrestrial" broadcasting. Among the advantages, mention may be made of the direct visibility between transmitter and receiver, the absence of echoes and, above all, a broad band of frequencies that can be used.

The success of satellite broadcasting has had the effect of gradually saturating the spectrum of available frequencies. It is necessary to use ever higher frequencies with ever broader bandwidths. At the present time, a satellite broadcasts over several carriers lying within the same frequency band. As an example, a satellite television receiver may, for example, receive 20 channels lying between 11.7 GHz and 12.1 GHz.

FIG. 1 shows an example of a satellite receiver of a conventional type which comprises a receiving block labelled LNB (Low Noise Block), mounted for example at the focus of a parabolic dish, and an internal unit labelled TUNER. The LNB receiving block comprises an antenna 1 followed by a low-noise amplifier 2. The signal delivered by the amplifier 2 is transposed to an intermediate frequency by means of a mixer 3 and an oscillator 4. The signal transmitted from the LNB receiving block to the TUNER internal unit has a working bandwidth lying around 1 to 2 GHz.

The TUNER internal unit comprises a first band-pass filter 5 which lets through only the signal of the working bandwidth coming from the LNB block. A frequency synthesizer 6, consisting for example of a voltage-controlled oscillator 7 and a phase-locked loop 8, delivers a tuning signal which allows a mixer 9 to frequency-transpose the working bandwidth so that a channel selected from this bandwidth lies around a predefined intermediate frequency. A second, more selective, filter 10 removes the other channels present in the working bandwidth. A mixer 11 coupled to a local oscillator 12 transposes the selected channel from the intermediate frequency to the baseband.

To achieve high-datarate transmission, the channels may be less broad than for television image broadcasting, that is to say between 5 and 50 MHz, but must be more numerous as the information is customized by each user. If one is in the Ka band, the frequency assignment made by the various standardization organizations defines the various frequencies that can be used, which are sometimes non-contiguous.

To obtain the desired bandwidth, it may be necessary to use non-contiguous bands in order to have a very broad bandwidth. As an example, it is possible to have a band consisting of two sub-bands, for example between 18.3 and 18.8 GHz and between 19.7 and 20.2 GHz separated by a forbidden band 900 MHz in width. The working bandwidth is then spread out over 1.9 GHz.

The use of a conventional device such as that in FIG. 1 is not possible for many reasons. Among others, the frequency synthesizer 6 would have to operate over a 1.9 GHz range. Unfortunately, it is very difficult to produce such a synthesizer using current means. The problem is solved for satellite television receivers by using several LNB blocks which bring the various bands down to a single intermediate frequency range or by using several TUNER units which operate at various frequency ranges.

SUMMARY OF THE INVENTION

It is an object of the invention to provide a simple solution for a broadband receiver whose received working bandwidth is split into at least two noncontiguous sub-bands.

The invention is a radiofrequency receiver comprising radiowave receiving means which convert an electromagnetic wave into a first signal, a first mixer which converts the first signal into a second signal by a fixed frequency transposition, a filtering means which converts the second signal into a third signal by selecting part of the spectrum of the said second signal and a second mixer which converts the third signal into a fourth signal by frequency transposition by means of a transposition signal coming from a frequency synthesizer. The filtering means comprises at least two band-pass filters of split bandwidths provided with switching means which make it possible to select only one of the filters.

The use of two switched filters makes it possible to use a single synthesizer to scan the at least two sub-bands of the working bandwidth. According to the invention, the frequency synthesizer operates for one sub-band in supradyne mode and for the other sub-band in infradyne mode.

According to one particular embodiment, the invention uses a third filter and divides the bandwidth into three sub-bands.

It is also an object of the invention, in order to be able to produce a two-way transmission device, to provide a similar solution for the transmitters which are optionally coupled to the receivers.

Thus, the subject of the invention is also a radiofrequency transmitter comprising a first mixer which converts a first signal into a second signal by frequency transposition by means of a transposition signal coming from a frequency synthesizer, a filtering means which converts the second signal into a third signal by selecting part of the spectrum of the said second signal, a second mixer which converts the third signal into a fourth signal by a fixed frequency transposition and radiowave transmission means which convert the fourth signal into an electromagnetic wave. The filtering means comprises at least two band-pass filters of split bandwidths provided with switching means which make it possible to select only one of the filters.

BRIEF DESCRIPTION OF THE DRAWINGS

The invention will be more clearly understood, and further features and advantages will appear on reading the following description, the description referring to the appended drawings in which:

FIG. 1 shows a satellite receiver according to the prior art;

FIG. 2 shows a first embodiment of a satellite receiver according to the invention;

FIG. 3 shows a first embodiment of a satellite transmitter according to the invention;

FIG. 4 shows signal spectra used in the receiver of FIG. 2;

FIG. 5 shows a second embodiment of a satellite receiver according to the invention;

FIG. 6 shows a second embodiment of a satellite transmitter according to the invention; and FIGS. 7 and 8 show signal spectra used in the receiver of FIG. 5.

DESCRIPTION OF THE PREFERRED EMBODIMENTS

To simplify the drawings and allow a person skilled in the art to better appreciate the differences between the invention and the prior art, the same references have been used for identical or very similar components.

FIG. 2 shows a first embodiment of a satellite receiver according to the invention. To make the operation of the receiver more clearly understood, reference should also be made to FIG. 4. This receiver operates within a high frequency range, for example the Ka band, and it has a bandwidth spread out over a spectral width w (FIG. 4a) with, for example, w equal to 1.9 GHz and lying between 18.3 and 20.2 GHz. The working part of the bandwidth is split into two sub-bands B1 and B2 (FIG. 4a) which have, for example, the same width, namely 500 MHz and are located between 18.3 and 18.8 GHz and between 19.7 and 20.2 GHz. The receiver comprises an LNB receiving block, mounted for example at the focus of a parabolic dish, and a TUNER internal unit.

The LNB block, of conventional structure, includes an antenna 1 followed by a low-noise amplifier 2. The signal delivered by the amplifier 2 is transposed to an intermediate frequency by means of a mixer 3 and an oscillator 4. The oscillator 4 delivers a signal of frequency Fosc, for example equal to 21.5 GHz, which makes it possible to obtain a signal output by the LNB block having the same spectral width w but transposed to a frequency more favourable to transmission over a coaxial cable. As an example, the signal transmitted to the TUNER unit is between 1.3 and 3.2 GHz.

The TUNER unit differs from the prior art by the use of filtering means 50, placed at the input, which receive the signal from the LNB block. The filtering means 50 comprise two filters 51 and 52 connected in parallel via switching means 53 and 54. The filters 51 and 52 are band-pass filters which let through the image bands B'1 and B'2 (FIG. 4b) of the sub-bands B1 and B2, respectively, after Fosc frequency transposition. The bands B'1 and B'2 correspond, for example, to the 1.3 to 1.8 GHz and 2.7 to 3.2 GHz bands. The switching means 53 and 54 are electronic switches controlled by a manual selector or by a control circuit (not shown). When it is desired to use the sub-band B1, all that is required is to position the switching means 53 and 54 so as to connect the filter 51 between the input and the output of the filtering means 50, so that, at the output of the filtering means, the spectrum of the working signal corresponds only to B'1, the band B'2 being suppressed. When it is desired to use the sub-band B2, all that is required is to position the switching means 53 and 54 so as to connect the filter 52 between the input and the output of the filtering means 50, so that, at the output of the filtering means, the spectrum of the working signal corresponds only to B'2, the band B'1 being suppressed.

A frequency synthesizer 6, consisting for example of a voltage-controlled oscillator 7 and a phase-locked loop 8, delivers a tuning signal which allows a mixer 9 to transpose the band selected B'1 or B'2. The tuning signal corresponds to a signal of frequency Fvco (FIG. 4b) which varies within a range having the same width as the width of the bands B'1 and B'2. Depending on the filter selected, the tuning signal either transposes the band B'1 or transposes the band B'2, the resulting band being either B"1 (FIG. 4d) or B"2 (FIG. 4c). The resulting band B"1 or B"2 is placed within the frequency spectrum by the tuning frequency Fvco so that a channel selected from the resulting band lies near an intermediate frequency FIo (FIGS. 4c and 4d), for example equal to 700 MHz. FIGS. 4c and 4d show by the solid line the resulting bands B"1 or B"2 which correspond to the signal of frequency Fvco represented by the solid line in FIG. 4b. The resulting bands B"1 or B"2 corresponding to the signal of frequency Fvco represented by the dotted lines in FIG. 4b are shown by the dotted lines in FIGS. 4c and 4d.

A filter 10, of the band-pass type, removes the unselected channels from the resulting band B"1 or B"2. The filter 10 is a band-pass filter with a high attenuation, a cut-off frequency of which corresponds to the intermediate frequency FIo and the width of which corresponds to the spectral occupancy of a channel, for example 5 MHz. A mixer 11 coupled to a local oscillator 12 transposes the selected channel into a base band.

FIG. 3 shows a first embodiment of a transmitter according to the invention. This transmitter operates in the same frequency bands as the receiver in FIG. 2. The transmitter consists overall of the same components as the receiver, but it is distinguished from the receiver by a reversal in the direction of the signal and the replacement of the amplifier 2 with a transmission amplifier 2b.

In the examples described above, the passbands of the two filters 51 and 52 and the range of variation in the frequency of the tuning signal Fvco are of the same width, which also means that the range of variation in the frequency of the tuning signal Fvco is centred between the two passbands. However, if the two available sub-bands B1 and B2 do not have the same width, it is appropriate not to have two filters having the same passband. Likewise, the range of frequency variation of the tuning signal Fvco must be adapted in order to be able to scan the broadest bandwidth.

However, if the imbalance between the two sub-bands B1 and B2 is too great and the separation between the sub-bands is too small, it becomes impossible to use the first embodiment of the invention. A second receiver embodiment is shown in FIG. 5. In order for the operation of the receiver to be more clearly understood, reference will be made to both FIG. 5 and FIG. 7.

This receiver operates in a high frequency range, for example the Ka band, and it has a bandwidth spread out over a spectral width w (FIG. 7a), with, for example, w equal to 1.75 GHz and lying between 28.35 and 30.1 GHz. The working part of the bandwidth is split into two sub-bands B1 and B2 (FIG. 7a) which have, for example, a width of 250 MHz between 28.35 and 28.6 GHz and a width of 750 MHz between 29.25 and 30.1 GHz. The receiver comprises an LNB receiving block, mounted for example at the focus of a parabolic dish, and a TUNER internal unit.

The LNB block, of conventional structure, comprises an antenna 1, a low-noise amplifier 2, a mixer 3 and an oscillator 4. The oscillator 4 delivers a signal of frequency Fosc (FIG. 7a), for example equal to 27.6 GHz. The operation of the LNB block is similar to the LNB block in FIG. 2. However, in this example, since the frequencies are different, the signal transmitted to the TUNER unit is between 0.75 and 2.5 GHz.

The TUNER unit comprises filtering means 50b, a synthesizer 6, two mixers 9 and 11, a filter 10 and a local oscillator 12. The filtering means 50b are located at the input and receive the signal from the LNB block. The filtering means 50b comprise three filters 51b, 52b and 55b connected in parallel via switching means 53b and 54b. The filters 51b, 52b and 55b are band-pass filters which let through the image bands B'1 and B'2a and B'2b (FIG. 7b) of the sub-bands B1 and B2, respectively, after transposition of a frequency Fosc. In this example, the image of the sub-band B2 is split into two bands B'2a and B'2b, one having the same width as the band B'1 and the other having twice the width. The bands B'1 and B'2a and B'2b correspond, for example, to the 0.75 to 1 GHz, 1.75 to 2 GHz and 2 to 2.5 GHz bands. The switching means 53b and 54b are electronic switches controlled by a manual selector or by a control circuit (not shown).

When it is desired to use the sub-band B1, all that is required is to position the switching means 53b and 54b so as to connect the filter 51b between the input and the output of the filtering means 50b so that, at the output of the filtering means, the spectrum of the working signal corresponds only to B'1, the bands B'2a and B'2b being suppressed. When it is desired to use the sub-band B2, either the filter 52b or the filter 55b is used, depending on whether the channel to be selected lies in the band B'2a or in the band B'2b.

The frequency synthesizer 6 comprises, in this example, a voltage-controlled oscillator 7, coupled to a phase-locked loop 8, but also a switch 61 and a frequency doubler 62. The doubler 62 is connected to the output of the voltage-controlled oscillator so that the signal output by the doubler 62 always delivers a signal at twice the frequency. The switch 61 is coupled to the switching means 53b and 54b so that the synthesizer 6 delivers the signal from the doubler 62 when the filter 55b corresponding to the double width band is selected. If one of the other filters, 51b or 52b, is selected, then the synthesizer delivers the tuning signal from the oscillator 7. The tuning signal corresponds to a signal of frequency Fvco (FIG. 7b) which varies within a range having the same width as the width of the bands B'1 and B'2a, for example 250 MHz. The signal output by the doubler corresponds to a signal of frequency 2Fvco (FIG. 7b) which varies within a range having the same width as the band B'2b, for example 500 MHz.

Depending on the filter selected, the tuning signal either causes transposition of the band B'1 or the transposition of the band B'2a or the transposition of the band B'2b, the resulting band being either B"1 (FIG. 7c) or B"2a (FIG. 7d) or B"2b (FIG. 7e). The resulting band B"1, B"2a or B"2b is placed within the frequency spectrum by the tuning frequency Fvco or by twice the frequency, 2Fvco, so that a channel selected from the resulting band lies near an intermediate frequency Flo (FIGS. 7c to 7e), for example equal to 500 Hz.

FIGS. 7c, 7d and 7e show by the solid line the resulting bands B"1, B"2a and B"2b which correspond to the signal of frequency Fvco represented by the solid line in FIG. 7b. The resulting bands B"1, B"2a and B"2b corresponding to the signal of frequency Fvco represented by the dotted lines in FIG. 7b are represented by the dotted lines in FIGS. 7c, 7d and 7e.

The filter 10 of the band-pass type removes the unselected channels from the resulting band B"1, B"2a or B"2b. The filter 10 is a band-pass filter with a high attenuation, a cut-off frequency of which corresponds to the intermediate frequency Flo and the width of which corresponds to the spectral occupancy of a channel, for example 5 MHz. A mixer 11 coupled to a local oscillator 12 transposes the selected channel into a baseband.

Of course, the invention is not limited to the numerical example mentioned. To determine the various frequencies used, all that is required is to make use of the following equations:

$$Flo=(a+b)/2;\ y=2a+b;\ x=(3a+b)/2$$

where a, b and c correspond to the widths of the sub-band B1, the forbidden band and the sub-band B2, respectively.

The value y corresponds to the minimum frequency of the oscillator 7, the maximum frequency being equal to x+a. The frequency Fosc is obtained by subtracting x from the low frequency of the sub-band B1, x representing the low frequency of the transposed image of the sub-band B1.

An illustrative example of a transmitter according to the second embodiment of the invention is shown in FIG. 6. This transmitter operates within the same frequency bands as the receiver of FIG. 5. The transmitter consists overall of the same components as the receiver, but is distinguished from the receiver by a reversal in the direction of the signal and the replacement of the amplifier 2 with a transmission amplifier 2b.

Many variants on the second embodiment are also possible, some of which are illustrated in FIG. 8. If the broader sub-band, for example B2, lies at a lower frequency than the narrower sub-band, for example B1, all that is required is to place the frequency of the oscillator 4 above the sub-band B1, as shown in FIG. 8a, in order to replace the narrower band on the lowest frequencies.

FIG. 8b illustrates a different distribution between the filters. The broadest part of the image of the broader sub-band is positioned at a lower frequency than the narrowest part. The circuits in FIGS. 5 and 6 remain unchanged but, however, it is necessary to adapt the cut-off frequencies of the filters 51b, 52b and 55b and also the various frequencies of the oscillators. The following equations will therefore be used, replacing those given above:

$$Flo=(3a+b)/2\ y=a+b;\ x=(a+b)/2.$$

Of course, a person skilled in the art will understand that it is also possible to produce a transmitter-receiver device by coupling a transmitter to a receiver, the transmitter/receiver coupling taking place according to a known technique.

The invention claimed is:

1. A signal processing apparatus comprising:
radiowave receiving means which convert an electromagnetic wave into a first signal,
a first mixer which converts the first signal into a second signal by a fixed frequency transposition,
a filtering means which converts the second signal into a third signal by selecting part of the spectrum of the said second signal,
a second mixer which converts the third signal into a fourth signal by frequency transposition by means of a transposition signal coming from a frequency synthesizer,
wherein the filtering means comprises a first bandpass filter for passing frequencies within a first frequency range, a second bandpass filter for passing frequencies within a second frequency range, wherein said first frequency range and said second frequency range are separated by a third frequency range, wherein said filtering means is provided with switching means which make it possible to select either said first bandpass filter or said second bandpass filter,
wherein the frequency synthesizer generates a transposition signal at a frequency determined in response the frequency range of the selected bandpass filter and the third frequency range.

2. The receiver according to claim 1, wherein the two filters have passbands of the same width.

3. The receiver according to claim 2, wherein the frequency synthesizer delivers a signal whose frequency varies within a frequency range of the same width as the bandwidths of the two filters.

4. The receiver according to claim 3, wherein the frequency range is centred between the two passbands.

5. The receiver according to claim 1, characterized in that the filtering means comprise three filters provided with switching means which make it possible to select only one of the filters, two filters having the same bandwidth, the third filter having a bandwidth twice as broad, and in that the frequency synthesizer delivers a signal whose frequency varies within a first frequency range, the width of which corresponds to the bandwidth of the two filters having the same bandwidth and within a second range which corresponds to twice the first range.

6. A radio frequency transmitter comprising:
   a first mixer which converts a first signal into a second signal by frequency transposition by means of a transposition signal coming from a frequency synthesizer,
   a filtering means which converts the second signal into a third signal by selecting part of the spectrum of the said second signal,
   a second mixer which converts the third signal into a fourth signal by a fixed frequency transposition,
   radiowave transmission means which convert the fourth signal into an electromagnetic wave,
   wherein the filtering means comprises, a first bandpass filter for passing frequencies within a first frequency range, a second bandpass filter for passing frequencies within a second frequency range, wherein said first frequency range and said second frequency range are separated by a third frequency range, and a switching means for selecting one of the first bandpass filter and second bandpass filter,
   wherein the frequency synthesizer generates a transposition signal at a frequency determined in response the frequency range of the selected bandpass filter and the third frequency range.

7. The transmitter according to claim 6, wherein the two filters have passbands of the same width.

8. The transmitter according to claim 7, wherein the frequency synthesizer delivers a signal whose frequency varies within a frequency range of the same width as the bandwidths of the two filters.

9. The transmitter according to claim 8, wherein the frequency range is centered between the two passbands.

10. The transmitter according to claim 6, wherein the filtering means comprise three filters provided with switching means which make it possible to select only one of the filters, two filters having the same bandwidth, the third filter having a bandwidth twice as broad and in that the frequency synthesizer delivers a signal whose frequency varies within a first frequency range, the width of which corresponds to the bandwidth of the two filters having the same bandwidth, and within a second range which corresponds to twice the first range.

* * * * *